May 14, 1963

J. C. MARINACE

FABRICATION OF PN JUNCTIONS BY DEPOSITION FOLLOWED BY DIFFUSION

Filed June 30, 1959

3,089,794

INVENTOR
JOHN C. MARINACE

BY Alvin J. Riddles
ATTORNEY

United States Patent Office 3,089,794

Patented May 14, 1963

3,089,794

FABRICATION OF PN JUNCTIONS BY DEPOSITION FOLLOWED BY DIFFUSION

John C. Marinace, Yorktown Heights, N.Y., assignor to International Business Machines Corporation, New York, N.Y., a corporation of New York Filed June 30, 1959, Ser. No. 825,863
2 Claims. (Cl. 148—1.5)

Figure 1:
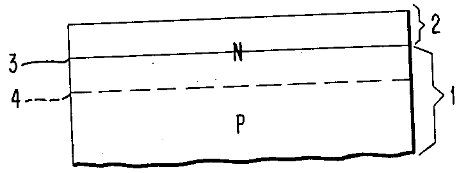

This invention relates to semiconductor structures and in particular to the formation of PN junctions in semiconductor structures.

As the semiconductor art, principally that of transistors, has advanced performance requirements of the devices being manufactured have directed close attention to the quantity of conductivity type determining impurities present in the crystal of the semiconductor device in the region immediately adjacent the junction. The phenomena of "Avalanche" and "Zener" junction breakdown and the parameter of distributive capacitance associated with junctions in semiconductor material have been found to governed by the quantity and distribution of the conductivity type determining impurities in the region immediately adjacent to a junction in a semiconductor device so that a very close control of the quantities of these conductivity type determining impurities in the region adjacent to a junction has become a very desirable and essential requirement in semiconductor device structures.

In addition to the impurity concentration requirement described above it is also necessary to very precisely control the dimensions of the body of a semiconductor device. It has become established in the art, that the technique of epitaxial deposition of semiconductor material is an advantageous way of providing specific dimension control in high quality single crystal semiconductor materials. The technique of semiconductor epitaxial deposition involves the addition of semiconductor material to a crystalline substrate including desired conductivity type determining impurities in such a manner that the crystalline orientation and periodicity is maintained. The technique, as it has been practiced in the art to date, involves a pyrolitic or a pyrolitic-disproportionation type of chemical reaction, generally involving a halogen transport element wherein semiconductor material in the form of a halide compound is caused to decompose on a semiconductor crystal substrate to provide a deposit which retains the orientation and periodicity of the crystalline substrate. The substrate usually has an interatomic spacing very close to that of the deposited material and may for example be of the same or a different semiconductor material. Techniques of providing epitaxial deposition types of reactions may be found in for example U.S. Patents 2,692,839 and 2,763,581.

While the technique developed thus far in the art, as described in the above references, is capable of forming PN junctions, such PN junctions have not been subject to ready control, as to the concentration and distribution of impurities closely adjacent to the junctions an item of importance in device structures as has been discussed above. The junctions made by the technique of epitaxial deposition as the art has thus far developed are what is known in the art as abrupt, or, in other words, there is a rapid change in conductivity type impurity concentration from one side of the junction to the other.

What has been discovered is a technique of providing a control on the concentration of the conductivity type determining impurities in a region adjacent a junction in a semiconductor device where the dimensions of the device body have been closely controlled by the use of the technique of epitaxial deposition and to provide a junction in a substrate formed by the technique of epitaxial deposition wherein the junction is moved from the substrate-deposit interface a selected distance.

It is an object of this invention to provide a graded epitaxially deposited junction.

It is another object of this invention to provide a PN junction in an epitaxially deposited semiconductor structure that is not located at the interface between the substrate and the deposited material.

It is still another object of this invention to provide an improved control for the location of a junction in semiconductor material.

It is still another object of this invention to provide an improved diode.

It is another object of this invention to provide an improved transistor and method of making it.

The foregoing and other objects, features and advantages of the invention will be apparent from the following more particular description of a preferred embodiment of the invention as illustrated in the accompanying drawings.

In the drawings:

FIGURE 1 is a section of a semiconductor structure illustrating a PN junction formed within the substrate in accordance with the invention.

Figure 2A:
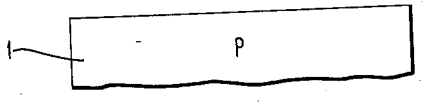
Figure 2B:
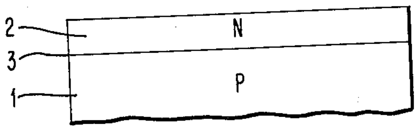
Figure 2C:
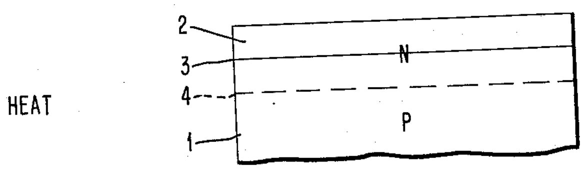

FIGURES 2*a*, 2*b* and 2*c* comprise a flow chart illustrating one application of the technique of the invention.

Referring now to FIGURE 1, a sectional view of a semiconductor structure incorporating a junction formed in accordance with the invention is shown. The structure comprises an original substrate 1 which for example may be a monocrystalline body of semiconductor material upon which has been epitaxially deposited further monocrystalline semiconductor material 2. For purposes of illustration, the original substrate is labelled P conductivity type indicating a predominance of conductivity type determining impurities of the acceptor type and the original surface of the region 1 is shown as a line labelled "Element 3," which is the substrate-deposit interface. In the epitaxial deposition reaction, a quantity of conductivity type determining impurities are included and upon completion of the deposition operation, these impurities, which for illustration may be considered to be of the donor type impart N conductivity type to the portion of the structure labelled "Element 2." In accordance with the invention a heat treating operation next takes place which causes the conductivity type determining impurities in the substrate and in the deposited material 2 to migrate from their original locations. In the illustration of FIGURE 1, the donor impurities in the deposited portion 2 migrate past the surface of the substrate 3 and into the P conductivity type region of the substrate 1.

In a region of a semiconductor crystal where N conductivity type determining impurities predominate over P conductivity type determining impurities, that portion of the crystal will exhibit N conductivity type. Conversely where the P type impurities predominate the crystal will exhibit P conductivity type. The heat treatment step operates in conjunction with the concentrations and diffusion properties of the impurities to cause a desired type to predominate in a region other than the one in which the predominance was located when a structure was fabricated. Since junctions are determining by a balance of N and P type impurities, junctions may be located in a structure as desired. In FIGURE 1 the PN junction which is labelled and shown dotted as element 4, is shown as having been moved away from the original substrate surface 3 and into the body of the substrate so that all semiconductor material including the deposited material has been labelled "N" conductivity type.

Referring now to FIGURE 2*a*, a flow chart is shown in which Element 1, the crystalline substrate is position under proper conditions for epitaxial deposition. The substrate 1 is usually cleaned and a convenient way to accomplish the cleaning is to reverse the temperature profile in the deposition reaction of the container such that the semiconductor material of the substrate 1 tends to combine with the transport element and deposit elsewhere in the container. This is usually done by making the substrate 1 hotter than the rest of the container. In this arrangement portions of the substrate 1 are in effect etched away and a clean crystalline surface is provided.

Referring next to FIGURE 2*b*, a temperature profile in the container of the deposition reaction is established, usually by making the substrate cooler than the remainder of the container, so that a compound of the semiconductor material and the transport element tends to decompose on the substrate 1 whereby a deposit 2 of semiconductor material of the same crystalline orientation and periodicity as the substrate 1, grows from the surface 3. In the deposition operation a sufficient quantity of N conductivity type determining impurities are included in the deposit 2. These N conductivity type determining impurities are of a type having appropriate solid solubility and diffusion coefficients and concentrations in the semiconductor material of the substrate and the deposit that they can be caused to migrate in a heat treating operation in a later step that will assure the positioning of the junction at the desired point. The deposit 2 is labelled N conductivity type for the purposes of illustration.

Referring next to FIGURE 2*c*, a heating operation takes place which imparts sufficient energy to the conductivity type determining impurities in the substrate 1 and in the deposit 2 to effectively change the predominance of the impurities in the region they occupied during fabrication of the structure. It is particularly desirable that the heat treatment can alter the concentration of these impurities in the vicinity of a junction and to move a junction such as the one shown dotted as Element 4 in FIGURES 1 and 2*c* to a new location away from the original surface 3 of the substrate by causing, in this illustration, the N conductivity type determining impurities to predominate over the P conductivity type determining impurities in another portion of the structure. By choosing appropriate acceptors and donors on the basis of the solid solubilities, diffusion coefficients and concentrations in particular semiconductor material of the substrate 1, the junction 4 can be moved into the substrate by putting a high concentration of a fast diffusing high solubility donor in the deposited region 2. And conversely, if the substrate has the higher concentration of such an impurity the junction will move into the deposited region 2. Since the concentration of an impurity can override the effect of the solid solubility and the diffusion coefficients, this fact should be taken into consideration when selecting the proper impurity materials.

While theory would indicate that the surface 3 of the substrate 1, if properly etched, would provide a good location for a junction, in actual practice it has been found that certain undesirable device characterisitcs are encountered with a junction that is epitaxially deposited on a surface. One disadvantage is a phenomenon known in the art as deep impurity energy levels. The deep impurity energy level phenomenon, in essence, may be considered to be the effect of a conductivity type determining impurity at an energy level between the valence band and the conduction band of the semiconductor material at a position closer to the valence band than the conduction band. These deep impurity energy levels when occurring in semiconductor materials impart undesirable performance to structures made from the material and they may serve as recombination centers. In addition, very often the crystal structure is not everywhere continuous from the substrate into the deposit even though the deposit is epitaxial.

In order to establish a proper perspective the following specifications are provided.

Structures as illustrated in FIGURE 1 that are suitable for diode type applications have been formed by an epitaxial deposition process wherein the region 2 is germanium deposited by the disproportionation-pyrolitic decomposition of $GeI_2$ and GE and $GeI_4$ with arsenic as a conductivity type determining impurity to a depth of approximately 0.020 of an inch on a P type germanium substrate 1 and the junction 4 is moved from the surface region 3 through a heat treatment operation wherein the semiconductor structure was maintained at a temperature of about 630° C. between 16 and 64 hours.

What has been described is a technique changing the predominance of impurities in an epitaxially deposited semiconductor structure from that of the structure as fabricated, and, the change in turn may provide a graded semiconductor junction away from the interface of a substrate in an epitaxial deposition. As a result of the invention the advantages of control of impurity concentrations at junctions may be imparted to devices while controlling the dimensions in an epitaxial deposition type process thereby permitting a wide range of structures.

While the invention has been particularly shown and described with reference to a preferred embodiment thereof, it will be understood by those skilled in the art that various changes in form and details may be made therein without departing from the spirit and scope of the invention.

What is claimed is:

1. A method of producing a PN junction semiconductor structure, comprising the steps of:

epitaxially depositing from the vapor an additional quantity of semiconductor material, including a particular conductivity-type determining impurity, onto an original, compatible semiconductor substrate, containing an opposite conductivity-type determining impurity, so as to form at the interface an abrupt junction having a sharp change in conductivity-type impurity concentration from one side of the junction to the other;

subjecting the combination of the deposited semiconductor material and the substrate semiconductor material to a heating operation whereby conductivity-type determining impurities in said combination are caused to move by diffusion and the junction is positioned at a location removed from the original interface between said deposited semiconductor material and said substrate semiconductor material.

2. A method as defined in claim 1 wherein said deposited semiconductor material and said substrate semiconductor material is germanium, wherein said deposited material has a depth of approximately 0.020 inch and the impurity in said deposited material is arsenic, and where said diffusion step is carried out at a temperature of approximately 630° C.

References Cited in the file of this patent

UNITED STATES PATENTS

| | | |
|---|---|---|
| 2,692,839 | Christensen et al. | Oct. 26, 1954 |
| 2,861,018 | Fuller et al. | Nov. 18, 1958 |
| 2,861,229 | Pankove | Nov. 18, 1958 |
| 2,879,190 | Logan et al. | Mar. 24, 1959 |
| 2,898,248 | Silvey et al. | Aug. 4, 1959 |
| 2,900,286 | Goldstein | Aug. 18, 1959 |
| 2,910,394 | Scott et al. | Oct. 27, 1959 |